United States Patent
Pust et al.

(10) Patent No.: US 10,629,784 B2
(45) Date of Patent: Apr. 21, 2020

(54) OPTOELECTRONIC COMPONENT, METHOD FOR PRODUCING AN OPTOELECTRONIC COMPONENT AND FLASHLIGHT FOR A PORTABLE DEVICE

(71) Applicant: OSRAM Opto Semiconductors GmbH, Regensburg (DE)

(72) Inventors: Philipp Pust, Langquaid (DE); Martin Noemer, Donaustauf (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/082,921

(22) PCT Filed: Mar. 15, 2017

(86) PCT No.: PCT/EP2017/056162
§ 371 (c)(1),
(2) Date: Sep. 6, 2018

(87) PCT Pub. No.: WO2017/158052
PCT Pub. Date: Sep. 21, 2017

(65) Prior Publication Data
US 2019/0097096 A1    Mar. 28, 2019

(30) Foreign Application Priority Data
Mar. 16, 2016   (DE) .................. 10 2016 104 875

(51) Int. Cl.
*H01L 33/50*   (2010.01)
*F21L 4/02*   (2006.01)

(52) U.S. Cl.
CPC ............ *H01L 33/504* (2013.01); *F21L 4/027* (2013.01); *H01L 33/502* (2013.01); *H01L 2933/0041* (2013.01)

(58) Field of Classification Search
CPC . H01L 33/504; H01L 2933/0041; F21L 4/027
(Continued)

(56) References Cited

U.S. PATENT DOCUMENTS

2006/0192178 A1   8/2006 Hirosaki
2007/0164308 A1   7/2007 Yoshimura et al.
(Continued)

FOREIGN PATENT DOCUMENTS

| DE | 102014107972 A1 | 10/2015 |
|---|---|---|
| DE | 102014112681 A1 | 3/2016 |
| EP | 2629341 A1 | 8/2013 |

*Primary Examiner* — Tong-Ho Kim
(74) *Attorney, Agent, or Firm* — McDermott Will & Emery LLP

(57) ABSTRACT

The invention relates to an optoelectronic component (100) comprising a semiconductor chip (1) for generating a primary beam in the blue spectral range, a conversion element (4) which is arranged in the beam path of the semiconductor chip (2) and is designed to generate a secondary beam from the primary beam, wherein the conversion element (4) comprises at least one first luminescent material (9) used as a conversion material, the first luminescent material (9) being $(La_{1-x}Ca_x)_3Si_6(N_{1-y}O_y)_{11}:Ce^{3+}$ with $0 \leq x \leq 1$ and $0 < y \leq 1$, wherein a total beam (G) emerging from the component (100) is white mixed light.

19 Claims, 5 Drawing Sheets

Figure 1:
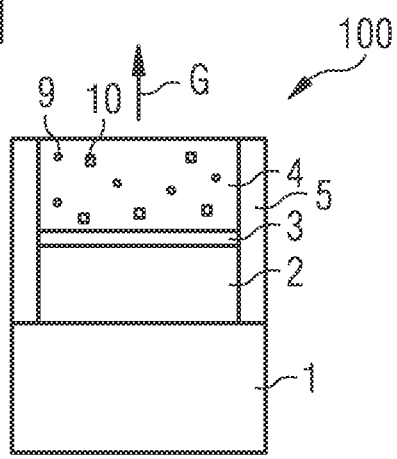

(58) Field of Classification Search
USPC .......................................................... 257/98
See application file for complete search history.

(56) References Cited

U.S. PATENT DOCUMENTS

| | | |
|---|---|---|
| 2007/0278935 A1 | 12/2007 | Harada |
| 2009/0303694 A1* | 12/2009 | Roth .................. C09K 11/7734 362/84 |
| 2012/0043352 A1 | 2/2012 | Rasmussen et al. |
| 2013/0234588 A1* | 9/2013 | Seto .................. C09K 11/0883 313/503 |
| 2014/0104874 A1* | 4/2014 | Park .................. C09K 11/0883 362/608 |
| 2016/0043279 A1 | 2/2016 | Jean et al. |

* cited by examiner

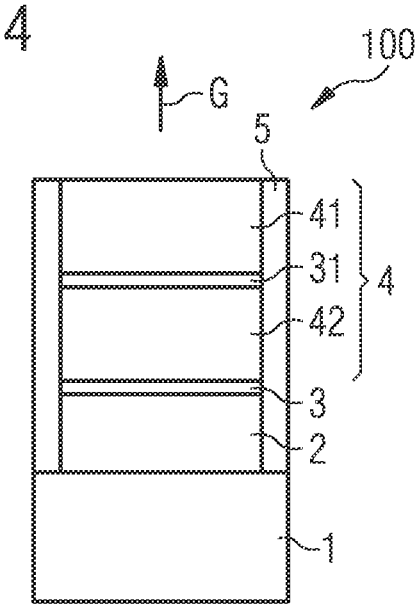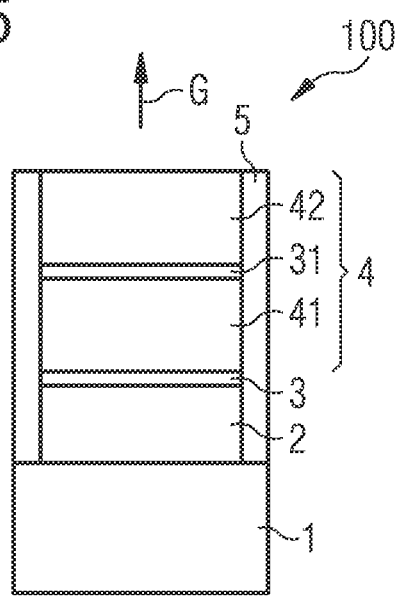

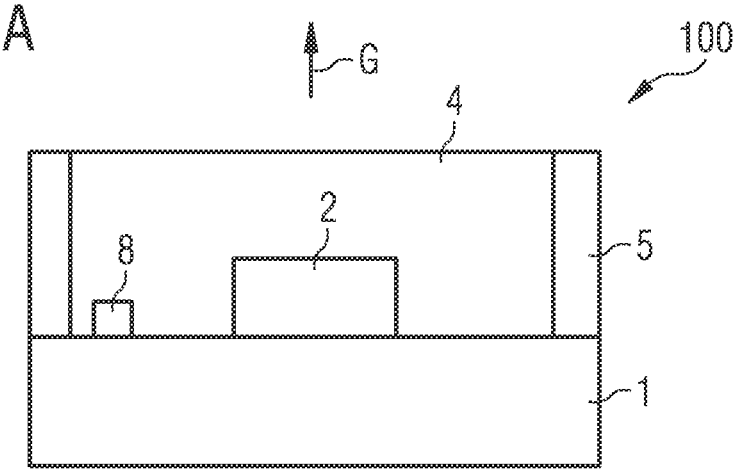
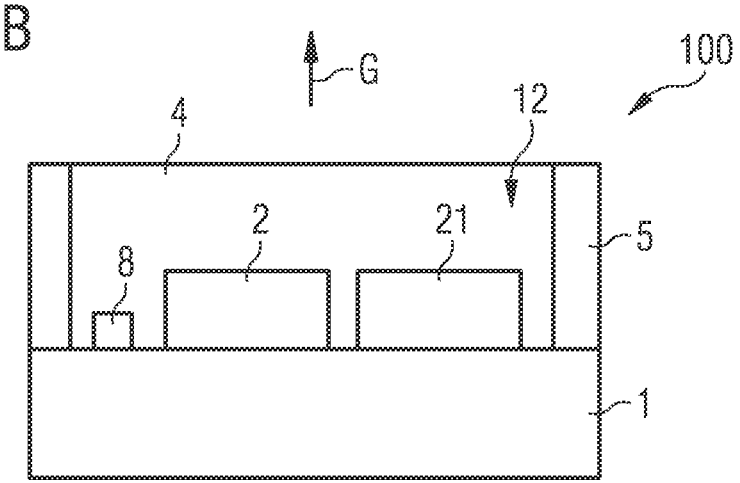

OPTOELECTRONIC COMPONENT, METHOD FOR PRODUCING AN OPTOELECTRONIC COMPONENT AND FLASHLIGHT FOR A PORTABLE DEVICE

CROSS-REFERENCE OF RELATED APPLICATIONS

This application is the U.S. National Phase under 35 U.S.C. § 371 of International Patent Application No. PCT/EP2017/056162, filed on Mar. 15, 2017, which in turn claims the benefit of German Application No. 10 2016 104 875.5, filed on Mar. 16, 2016, the entire disclosures of which Applications are incorporated by reference herein.

DESCRIPTION

Optoelectronic component, method for producing an optoelectronic component and flashlight for a portable device.

The invention relates to an optoelectronic component. The invention further relates to a method for producing an optoelectronic component. The invention further relates to a flashlight illumination for a portable device.

Optoelectronic components are preferably used for flash light applications in portable devices, such as mobile telephones or cameras, since such components advantageously have an emission spectrum in which as many regions of the visible light as possible are present with a similar intensity. In order to be able to provide sufficient light for flash light applications, the optoelectronic components are briefly pulsed or operated at high current intensities in continuous operation (flash). In order to be able to produce a balanced optoelectronic component spectrum, a blue-emitting semiconductor chip is typically used, in particular with a dominant wavelength between 440 nm and 455 nm, coated with one or more different phosphors. For a high color rendering index (CRI>75), generally two or more phosphors are used in order to be able to cover the visible spectrum sufficiently well. In most cases, the yellow-green emitting phosphor is formed from the material system of garnets and the red-orange emitting phosphor is a europium-doped material. A known problem is that europium-doped compounds frequently exhibit strong efficiency dips at high current intensities, which lead to color locus instability and also to the loss of brightness of the optoelectronic component.

An object of the invention is to provide an optoelectronic component which emits radiation efficiently during operation of the component. The invention further relates to a method for producing an optoelectronic component which produces an efficient component. The invention further relates to a flashlight illumination that is efficient.

These objects are achieved by an optoelectronic component according to independent claim 1. Advantageous embodiments and developments of the invention are the subject matter of the dependent claims. Furthermore, these objects are achieved by a method for producing an optoelectronic component according to independent claim 14. Furthermore, these objects are achieved by means of a flashlight illumination according to independent claim 15.

In at least one embodiment, the optoelectronic component comprises a semiconductor chip. The semiconductor chip is configured to generate a primary radiation in the blue spectral range. The component has a conversion element. The conversion element is arranged in the beam path of the semiconductor chip and is configured to generate secondary radiation from the primary radiation. The conversion element comprises at least one first phosphor as a conversion material or consists thereof, wherein the first phosphor is $(La_{1-x}Ca_x)_3Si_6(N_{1-y}O_y)_{11}:Ce^{3+}$ where $0 \leq x \leq 1$ and $0 \leq y \leq 1$. An overall radiation exiting from the component is white mixed light.

According to at least one embodiment, the first phosphor is $La_{1-x}Ca_x)_3Si_6(N_{1-y}O_y)_{11}:Ce^{3+}$ where $0 \leq x \leq 1$ and $0 < y \leq 1$. The first phosphor therefore necessarily has oxygen. In particular, the following applies: y=0.001; 0.01; 0.1; 0.2; 0.3; 0.4; 0.5; 0.6; 0.7; 0.8 or 0.95.

Additionally or alternatively it applies that: x=0.001; 0.01; 0.1; 0.2; 0.3; 0.4; 0.5; 0.6; 0.7; 0.8 or 0.95.

According to at least one embodiment, the optoelectronic component is a light-emitting diode, LED for short.

Here and in the following, "overall radiation" is understood to mean mixed radiation of primary radiation from the at least one semiconductor chip and of secondary radiation emitted by the conversion element, which ultimately leaves the component. The mixing ratio of primary radiation and secondary radiation can be regulated and controlled by the composition and the concentration of the corresponding phosphors or of the phosphor in the conversion element. In the case of full conversion, the overall radiation can also be only the secondary radiation. In the case of partial conversion, the overall radiation can be the sum of primary radiation from the semiconductor chip and secondary radiation from the conversion element. The secondary radiation can be composed of radiation emitted from the first phosphor and radiation emitted from the second phosphor or a further phosphor.

White mixed light of the component is generated here in particular by partial conversion. The term "white" is used here and below in the meaning that the overall radiation has a color locus in the CIE color diagram with Cx and Cy values along the Planck locus or in the isotherms thereof. For flash lights, the color loci are preferably at color temperatures between 2000 and 8000 K. For example, the color locus can lie in the range of Cx 0.3 to 0.4 and Cy 0.3 to 0.4. The color locus here designates points in or on a color body which is described in terms of its position in the color space with suitable coordinates. The color locus represents the perceived color for a viewer. The color locus is a coordinate or coordinates in the standard valence system. The CIE standard valence system is referred to here and below according to the standard of 1931. The CIE color diagram forms the totality of all perceptible colors, that is the visible part of the electromagnetic radiation. Within this diagram, any desired color is defined by means of three coordinates, Cx, Cy and Cz, wherein two coordinates are sufficient for color determination, since the sum of all three coordinates always has to be 1. Cz can therefore easily be calculated from Cx and Cy. Such a color coordinate is referred to here as the color locus of the overall radiation.

According to at least one embodiment, the optoelectronic component has at least one semiconductor chip. Alternatively, the optoelectronic component can also have more than one semiconductor chip, for example a further semiconductor chip, i.e. two semiconductor chips. The semiconductor chips can have the same structure. The at least one optoelectronic semiconductor chip has a semiconductor layer sequence. The semiconductor layer sequence comprises an active layer having at least one pn-junction and/or having one or more quantum well structures. The semiconductor layer sequence of the semiconductor chip is preferably based on a III-V compound semiconductor material. The semiconductor material is preferably a nitride compound semiconductor material, such as $Al_nIn_{1-n-m}Ga_mN$, or else a phosphide compound semiconductor material, such as $Al_nIn_{1-n-m}Ga_mP$, wherein in each case $0 \leq n \leq 1$, $0 \leq m \leq 1$ and $n+m \leq 1$. The semiconductor material can likewise be $Al_xGa_{1-x}As$ where $0 \leq x \leq 1$. In this case, the semiconductor layer sequence can have dopants and additional constituents. For the sake of simplicity, however, only the essential components of the crystal lattice of the semiconductor layer sequence are mentioned, that is Al, As, Ga, In, N or P, even if these can be partially replaced and/or supplemented by small quantities of further substances.

In the operation of the at least one semiconductor chip or of two semiconductor chips, a primary radiation is generated in each case in the active layer. A wavelength or the wavelength maximum of the primary radiation is preferably in the ultraviolet and/or visible and/or IR spectral range, in particular at wavelengths between 420 nm and 800 nm inclusive, for example between 440 nm and 480 nm inclusive. The semiconductor chip is preferably configured to generate primary radiation from the blue spectral range during operation.

According to at least one embodiment, the semiconductor chip comprises a semiconductor layer sequence composed of InGaN. Additionally or alternatively, the primary radiation can have a wavelength maximum between 380 nm and 480 nm inclusive.

According to at least one embodiment, the optoelectronic component has a further semiconductor chip, which is designed to generate a further primary radiation in the blue spectral range. In particular, the semiconductor chip and the further semiconductor chip are arranged in a common recess, wherein the conversion element is formed as a casting and surrounds both semiconductor chips in a form-fitting manner. Here and in the following, 'form-fitting' means that the conversion element directly mechanically and/or electrically surrounds both the radiation exit areas and the side surfaces of the respective semiconductor chips.

Here and in the following, color data relating to emitting conversion elements and/or to the overall radiation and/or to emitting semiconductor chips designate the respective spectral range of the electromagnetic radiation.

According to at least one embodiment, the component comprises a conversion element. The conversion element is arranged in the beam path of the semiconductor chip. In particular, the conversion element is arranged directly on the semiconductor chip, that is on the radiation exit area thereof. Here and in the following, 'direct' means that the conversion element is arranged directly on the radiation exit area of the semiconductor chip, which means that no further layers or elements are present between the semiconductor chip and the conversion element, such as, for example, adhesive layers.

Alternatively, the conversion element and the semiconductor chip can also be spatially separated from one another. For example, an adhesive layer can then be arranged between the semiconductor chip and the conversion element.

The conversion element is configured to absorb the primary radiation emitted by the at least one semiconductor chip or the total primary radiation, if more than one semiconductor chip is present, at least partially and to convert it into a secondary radiation preferably having a wavelength different from the wavelength of the primary radiation, in particular a longer wavelength. The conversion element comprises at least one first phosphor. In particular, the conversion element has, in addition to the first phosphor, a further, second phosphor or consists thereof.

According to at least one embodiment, the first phosphor is $(La_{1-x}Ca_x)_3Si_6(N_{1-y}O_y)_{11}:Ce^{3+}$ where $0 \leq x \leq 1$ and $0 \leq y \leq 1$. Preferably, $0.5 \leq x \leq 1$, for example $x=0.6$, applies. Alternatively or additionally, $0.5 \leq y \leq 1$, for example $y=0.5$, applies. Preferably $0 \leq x \leq 0.5$, for example $x=0.1$, applies. As an alternative or in addition, $0 \leq y \leq 0.5$, for example $y=0.1$, applies.

According to at least one embodiment, the first phosphor has a wavelength maximum between 530 nm and 570 nm inclusive, preferably between 555 nm and 560 nm, for example 557 nm.

According to at least one embodiment, the conversion element exclusively comprises the first phosphor as conversion material. In other words, the conversion element therefore has no further phosphor which converts a primary radiation into a secondary radiation. In particular, the color locus of the component is between 6000 K and 3500 K on the Planck's black body curve. The first phosphor can be embedded in a non-emissive matrix material.

According to at least one embodiment, the first phosphor has a color locus for Cx between 0.420 and 0.490 and for Cy between 0.500 and 0.560.

According to at least one embodiment, the first phosphor is $La_3Si_6(N_{1-y}O_y)_{11}:Ce^{3+}$ where $0 \leq y \leq 0.05$.

According to at least one embodiment, the conversion element exclusively comprises a cerium-doped phosphor or a plurality of cerium-doped phosphors as conversion materials. The conversion element preferably comprises only the first phosphor, which is a cerium-doped phosphor, as a conversion material or consists thereof. The first phosphor can reach more strongly red-shifted color loci than, for example, a garnet such as $(Y,Lu)_3(Al,Ga)_5O_{12}:Ce^{3+}$. Lower color temperatures (CCTs) can also be obtained with a mixture of several cerium-doped phosphors rather than, for example, with materials of the garnet type. In this case, cerium-doped phosphors generally exhibit better stability with respect to high-current quenching than, for example, europium-doped phosphors.

According to at least one embodiment, the conversion element comprises a second phosphor. The second phosphor is advantageously a cerium-doped $(Y,Lu)_3(Al,Ga)_5O_{12}$. The white mixed light of the component is composed of the primary radiation of the semiconductor chip, of the radiation emitted by the first phosphor and of the radiation emitted by the second phosphor.

According to at least one embodiment, the second phosphor is selected from a group comprising $(Ca, Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$ and $(Ba,Sr)_2Si_5N_8:Eu^{2+}$.

According to at least one embodiment, the second phosphor is a europium-doped $(Ca,Sr)AlSiN_3$ or $(Ba,Sr)_2Si_5N_8$.

According to at least one embodiment, the first phosphor and optionally the second phosphor are dispersed in a matrix material. In addition, the conversion element is arranged directly on the radiation exit area of the semiconductor chip or is arranged downstream thereof. The matrix material used may be, for example, a silicone such as dimethylvinylsiloxane and/or vinylalkylpolysiloxane. Alternatively, an epoxy resin or hybrid materials, for example ormocers, can also be used as matrix material. In this case, the proportion of the dispersed first phosphor or of all converter materials in the matrix material can be between 1% by weight and 50% by weight.

According to at least one embodiment, the conversion element is formed as a layer system. The layer system comprises at least two layers, wherein the first layer comprises the first phosphor and the second layer comprises the second phosphor. In particular, the second layer is arranged between the semiconductor chip and the first layer. Alternatively, the first layer is arranged between the semiconductor chip and the second layer.

If the first layer is arranged between the semiconductor chip and the second layer, this means that the first layer is arranged directly downstream of the semiconductor chip. If the second layer is arranged between the semiconductor chip and the first layer, this means that the second layer is arranged directly downstream of the semiconductor chip in the radiation direction.

The individual layers of the layer system of the conversion element can have a layer thickness of 20 μm to 200 μm.

According to at least one embodiment, the conversion element is formed as a ceramic.

The inventors have recognized that by the use of the first phosphor $(La_{1-x}Ca_x)_3Si_6(N_{1-y}O_y)_{11}:Ce^{3+}$ wherein $0 \leq x \leq 1$ and $0 \leq y \leq 1$ in the conversion element, a more reddish-shifted color locus can be generated at lower CCTs, compared with garnet phosphors, such as $(Y,Lu)_3(Al,Ga)_5O_{12}:Ce^{3+}$. In addition, the optoelectronic component exhibits a less pronounced color locus shift over the current and a lower brightness loss, since exclusively cerium-doped phosphors are used and thus a possible quenching in the case of high currents is avoided. On the other hand, the use of the optoelectronic component according to the invention allows a higher current density.

The invention further relates to a method for producing an optoelectronic component. The optoelectronic component described above is preferably produced using this method. All definitions and statements as specified above for the optoelectronic component apply to the method and vice versa.

According to at least one embodiment of the method, said method comprises the following steps:

A) provision of a semiconductor chip for generating a primary radiation in the blue spectral range, B) provision of a conversion element which is arranged in the beam path of the semiconductor chip and which is for generating secondary radiation from the primary radiation, wherein the conversion element comprises at least one first phosphor as conversion material, wherein the first phosphor is $(La_{1-x}Ca_x)_3Si_6(N_{1-y}O_y)_{11}:Ce^{3+}$ and $0 \leq x \leq 1$ and $0 \leq y \leq 1$, wherein an overall radiation exiting from the component is white mixed light.

The invention further relates to a flashlight illumination for a portable device. Preferably, the flashlight illumination comprises the optoelectronic component described above. All the definitions and statements made for the optoelectronic component also apply to the flashlight illumination and vice versa.

In particular, the flashlight illumination described here is used for portable devices, in particular for mobile telephones or cameras.

Further advantages, advantageous embodiments and developments will become apparent from the exemplary embodiments described below in conjunction with the figures.

IN THE FIGURES

Figure 7A:
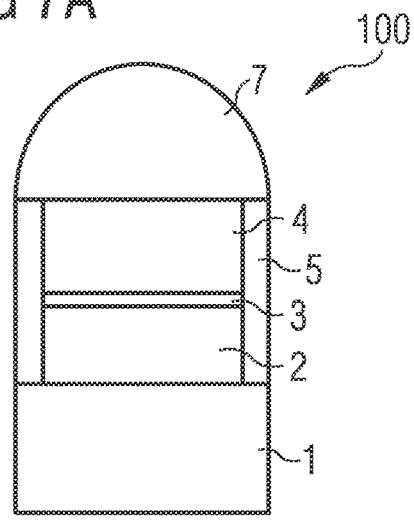
Figure 7B:
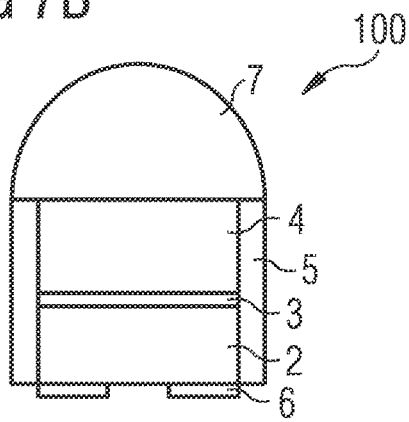
Figure 7C:
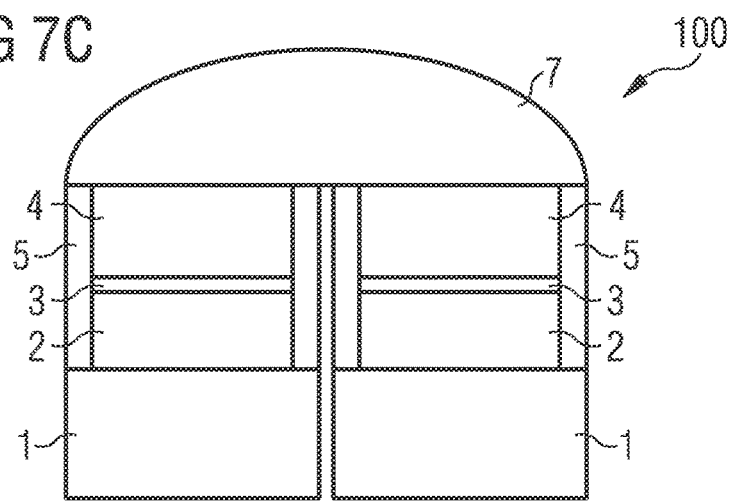
Figure 7D:
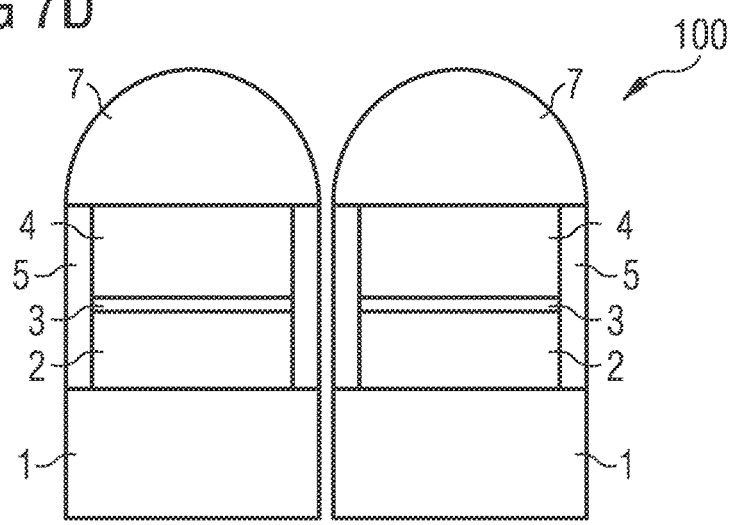
Figure 8:
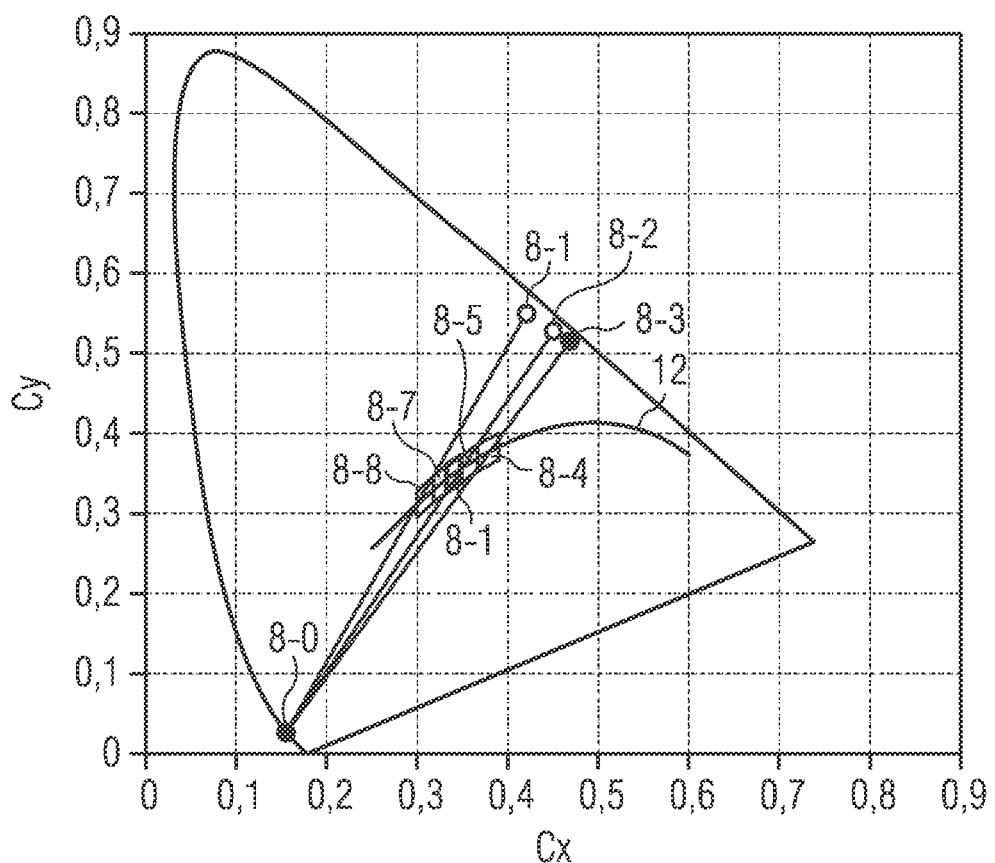
Figure 9:
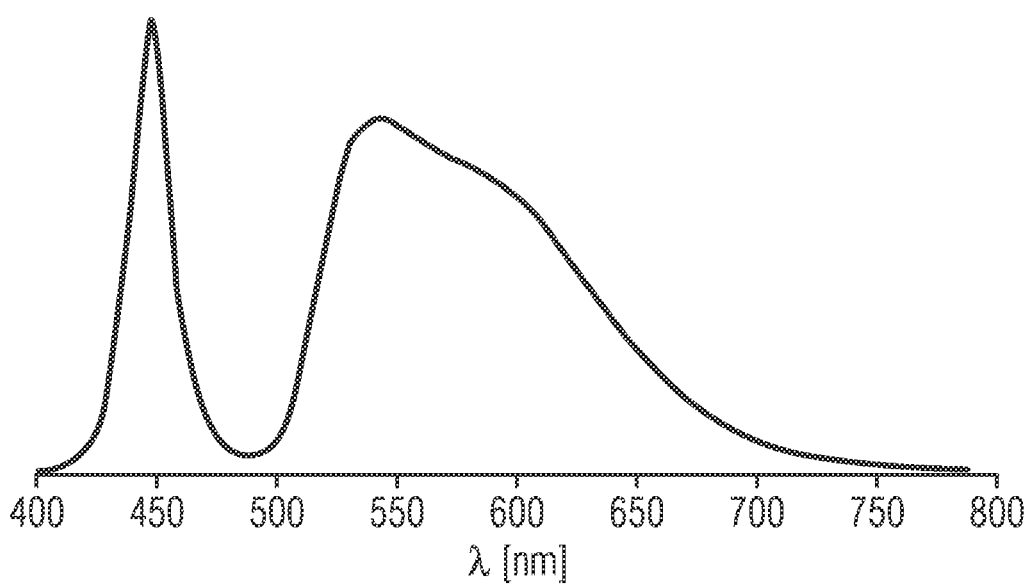

FIGS. 1 to 7D each show a schematic sectional illustration of an optoelectronic component according to an embodiment, FIG. 8 shows a CIE color diagram according to an embodiment, and FIG. 9 shows an emission spectrum according to an embodiment.

In the exemplary embodiments of the figures, identical, similar or identically acting elements can in each case be provided with the same reference symbols. The elements illustrated and their size relationships among one another are not to be regarded as true to scale. Rather, individual elements, such as, for example, layers, parts, components and regions, can be represented with an exaggerated size for better representability and/or for a better understanding.

FIG. 1 shows a schematic side view of an optoelectronic component 100 according to an embodiment. The optoelectronic component 100 comprises a substrate 1. The substrate 1 can be, for example, a semiconductor or ceramic wafer, for example a shaped material made of sapphire, silicon, germanium, silicon nitride, aluminum oxide, titanium dioxide, or a luminescent ceramic, such as, for example, YAG. Furthermore, it is possible for the substrate to be a printed circuit board, PCB, a metallic lead frame or another type of connection support. At least one semiconductor chip 2 can be arranged on the substrate. The semiconductor chip 2 can be, for example, an indium-gallium-nitride semiconductor chip. The semiconductor chip is preferably designed to emit radiation from the blue spectral range, for example between 440 nm and 480 nm, in the operation of the optoelectronic component 100. A conversion element 4 is arranged downstream of the semiconductor chip 2. The conversion element 4 is arranged in the beam path of the semiconductor chip 2 and is designed to convert the primary radiation emitted by the semiconductor chip into a secondary radiation having a changed, usually longer wavelength. An adhesive layer 3 may optionally be present between the conversion element 4 and the semiconductor chip 2. The adhesive layer 3 can be a high-refractive or a low-refractive material. The conversion element 4 can comprise the at least one first phosphor 9 $(La_{1-x}Ca_x)_3Si_6(N_{1-y}O_y)_{11}:Ce^{3+}$ wherein $0 \leq x \leq 1$ and $0 \leq y \leq 1$. Optionally, the conversion element 4 can have an additional second phosphor 10. The phosphors or the phosphor 9, 10 can be embedded in a matrix material, for example made of silicone. Depending on the selection of the matrix material and on the refractive index thereof, the adhesive layer can be selected accordingly. The optoelectronic component can furthermore optionally have a reflection element 5, for example made of titanium dioxide. The reflection element 5 surrounds both the side surfaces of the semiconductor chip and the side surfaces of the conversion element 4. The optoelectronic component 100 is designed to emit white mixed light as an overall radiation G.

According to the invention, a conversion element is provided which is formed at least from one or more cerium-doped phosphors. The conversion element comprises at least the first phosphor $La_{1-x}Ca_x)_3Si_6(N_{1-y}O_y)_{11}:Ce^{3+}$ wherein $0 \leq x \leq 1$ and $0 \leq y \leq 1$. Further phosphors can be present in the conversion element, for example the second phosphor $(Y,Lu)_3(Al,Ga)_5O_{12}:Ce^{3+}$. Alternatively, the first phosphor can also be present in the conversion element with a different stoichiometric composition and, thus, with a different emission behaviour. The phosphors can be embedded in silicone, epoxy or hybrid materials. Alternatively, the phosphors can also be formed as a ceramic. The selection of the mixing ratios and the concentrations of the phosphors are dependent on the respective color temperature of the white optoelectronic component. The color temperature is preferably in the range from 1000 to 20000 K, particularly preferably in the range of 2300 to 7500 K. The emission color loci of the white optoelectronic component are preferably located in the vicinity or on the Planck locus or on the Planck's black body curve or in the vicinity or on the respective isotherms. The conversion element 4 is applied to a blue-emitting semiconductor chip 2. In particular, the semiconductor chip 2 is an indium-gallium-nitride chip having a wavelength maximum in the range of 380 nm to 480 nm. The color locus of the first phosphor can be in the range for Cx between 0.420 and 0.490 and for Cy between 0.500 and 0.560 for an excitation wavelength of 455 nm. The peak wavelengths of the first phosphor can be in the range between 530 nm and 570 nm inclusive at an excitation wavelength of 455 nm.

Alternatively, more than one semiconductor chip can also be present in the optoelectronic component. In particular, the further semiconductor chips are designed to emit a further primary radiation in the wavelength range between 380 nm and 480 nm inclusive. A conversion element 4, which in particular has a cerium-doped first phosphor, can also be present on the further semiconductor chip. In addition, further phosphors?, for example a second phosphor, can be present in the conversion element 4. The resulting color loci of the white optoelectronic component are in this case as described above.

Preferably, the corresponding color locus is reached on the Planck's black body curve during operation with the same current for the semiconductor chips, in particular for two semiconductor chips. For example, one isotherm can be in the range of 1000 K to 5000 K and the second isotherm can be in the range of 5001 to 20000 K. Preferably, one isotherm is in the range of 2300 K to 4500 K and the other isotherm is in the range of 4501 K to 7500 K. In this case, it is possible that a plurality of semiconductor chips have a common light path. In other words, said optoelectronic component has a modular structure. Alternatively, each semiconductor chip can also have its separate light path or beam path. The color loci of the materials of the first phosphor can, for example at an excitation wavelength of 455 nm, lie in the range of Cx=0.420 to 0.490 and of Cy=0.500 to 0.560. The peak wavelength of the first phosphor can be in the range from 530 nm to 570 nm at an excitation wavelength of 455 nm.

Figure 2:
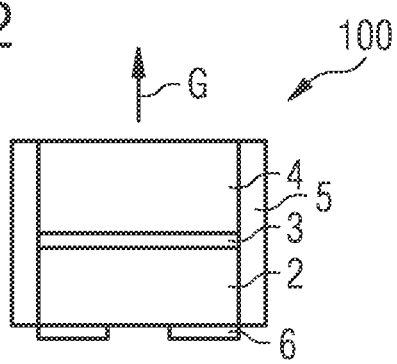

FIG. 2 shows a schematic side view of an optoelectronic component 100 according to an embodiment. The optoelectronic component 100 of FIG. 2 differs from that of FIG. 1 in that the component has no substrate 1. The component 100 of FIG. 2 is thus substrate-free and has contact webs 6. In this case, the semiconductor chip 2 is formed in particular as a flip-chip, i.e. comprises the contact webs 6, which are required for contacting, on a side surface.

Figure 3:
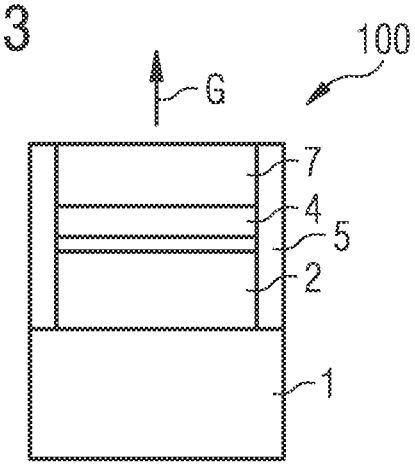

FIG. 3 shows a schematic side view of an optoelectronic component 100 according to an embodiment. FIG. 3 differs from the component 100 of FIG. 1 in that it additionally comprises a lens 7. The lens can be formed, for example, from silicone and can directly follow the conversion element, i.e. be in direct mechanical and electrical contact with the same.

FIG. 4 shows a schematic side view of an optoelectronic component 100 according to an embodiment. The component 100 of FIG. 4 differs from the component 100 of FIG. 1, for example, in that the conversion element 4 is formed as a layer system 41, 42. The conversion element 4 has a first layer 41, which comprises at least the first phosphor 9, and a second layer, which comprises at least the second phosphor 10. The two layers 41, 42 are spatially separated from one another by a further adhesive layer which may optionally be present. In the case of the component 100 of FIG. 4, the second layer 42 is arranged between the first layer 41 and the semiconductor chip 2. The second layer 42 is designed, in particular, to emit radiation from the green spectral region. The first layer is designed, in particular, to emit radiation from the red spectral region. The semiconductor chip 2 is designed in particular to emit primary radiation from the blue spectral region, so that the overall radiation G is a combination of the primary radiation of the semiconductor chip 2 and of the two secondary radiations of the layers 41, 42 of the conversion element 4. The overall radiation G is then in particular white mixed light.

FIG. 5 shows a side view of an optoelectronic component 100 according to an embodiment. The optoelectronic component 100 of FIG. 5 differs from the optoelectronic component 100 of FIG. 4 in that the layers 41, 42 of the conversion element 4 are interchanged. In other words, the first layer 41 in the component 100 of FIG. 5 is now arranged between the semiconductor chip 2 and the second layer 42. In other words, the red-emitting first layer 41 of the conversion element 4 is thus arranged downstream of the semiconductor chip 2 and the green, yellow or green-yellow emitting second layer 42 of the conversion element 4 is arranged downstream of the red-emitting first layer 41.

FIG. 6A shows a schematic side view of an optoelectronic component 100 according to an embodiment. The optoelectronic component 100 of FIG. 6 is almost identical to the optoelectronic component 100 of FIG. 1, except that the component of FIG. 6 additionally has a protective diode (ESD) 8. Said protective diode 8 can optionally be present in the component and can be spaced laterally from the semiconductor chip 2. The protective diode 8 can be arranged on the substrate 1 within the recess 12 of a component. The reflection element 5 can be part of a housing.

FIG. 6B shows a schematic side view of an optoelectronic component 100 according to an embodiment. The component of FIG. 6B differs from the component 100 of FIG. 6A in that the component 100 has a further semiconductor chip 21. In other words, the component 100 now has two semiconductor chips 2, 21. The two semiconductor chips 2, 21 are spaced apart laterally from one another and are arranged on the substrate 1. Furthermore, a protective diode (ESD) 8 may optionally be present. The two semiconductor chips 2, 21 can be arranged in a common recess 12. In this case, the conversion element 4 is in the form of a casting and preferably comprises the first phosphor 9 and the second phosphor 10 dispersed in a matrix material (not shown here).

FIGS. 7A and 7B each show a schematic side view of an optoelectronic component 100 according to an embodiment.

The component 100 of FIG. 7A differs from the component of FIG. 1 in that the component of FIG. 7A additionally has a lens 7. The lens 7 can be formed from silicone, for example. The lens 7 is arranged directly downstream of the conversion element 4, in particular.

The optoelectronic component 100 of FIG. 7B differs from the component of FIG. 2 in that the component of FIG. 7B additionally has a lens 7 which is arranged directly downstream of the conversion element 4.

FIG. 7C shows a schematic side view of an optoelectronic component 100 according to an embodiment. The optoelectronic component 100 of FIG. 7C has two semiconductor chips 2 which are each arranged on a substrate 1, which means that in total there are two substrates 1. One conversion layer 4 is arranged downstream of the respective semiconductor chips 2. The conversion layer 4 and the semiconductor chip 2 are optionally separated from one another by an adhesive layer 3. Optionally, the semiconductor chip and the conversion element can be embedded in a reflector potting 5, for example made of titanium dioxide.

The two semiconductor chips 2 have a common lens 7, which is arranged in a material-fitting and form-fitting manner on the radiation exit area of the respective conversion elements 4.

FIG. 7D shows a schematic side view of an optoelectronic component 100 according to an embodiment. The component 100 of FIG. 7D comprises two semiconductor chips 2, too. Compared to the component 100 of FIG. 7C, the component 100 of FIG. 7D differs in that each semiconductor chip 2 has its own lens 7. Alternatively, in comparison to the components 100 of FIGS. 7C and 7D, an optoelectronic component 100 can also comprise more than two semiconductor chips, for example four, five, six, seven, eight, nine, ten semiconductor chips. A plurality of semiconductor chips can have a common lens 7 or each semiconductor chip can have its own separate lens 7.

The optoelectronic components 100 shown in FIGS. 1 to 7D, apart from FIG. 2, can alternatively also have no substrate 1. The optoelectronic component 100 of FIG. 2 can alternatively additionally have a substrate 1 which is arranged in particular on the side of the semiconductor chip 2 facing away from the radiation exit area.

FIG. 8 shows a CIE color standard diagram. The Cy coordinate is represented as a function of the Cx coordinate. The circles 8-1 to 8-3 each point to a first phosphor. The phosphors differ in their stoichiometric composition and their degree of doping in accordance with the elemental formula $La_3Si_6(N_{1-y}O_y)_{11}:Ce^{3+}$ wherein $0 \leq y \leq 0.05$. The first phosphor identified by 8-1 has a color locus of Cx 0.42 to 0.44 and of Cy 0.53 to 0.57. The first phosphor identified by 8-2 has a color locus of Cx 0.43 to 0.48 and of Cy 0.51 to 0.56. The first phosphor identified by 8-3 has a color locus of Cx 0.45 to 0.49 and of Cy 0.50 to 0.55.

The numbering 8-0 here shows the color locus of the primary radiation. The curve 12 shows the Planck's black body curve. The quadrilateral 8-4 shows 4000 K ANSI. ANSI is the abbreviation for "American National Standards Institute". Here, a specific color temperature range, in this case 4000 K, is standardized by ANSI. This means that when the color locus or CCT varies within the corresponding spanned quadrangle, it can nevertheless be designated as 4000 K according to ANSI. The same also applies to the other color temperatures. The quadrilateral 8-5 shows 4500 K ANSI. The quadrilateral 8-6 shows 5000 K ANSI. The quadrilateral 8-7 shows 5700 K ANSI and the quadrilateral 8-8 shows 6500 K ANSI. It can be seen from the CIE color standard diagram that by using a blue-emitting semiconductor chip and at least one first phosphor a component can be produced which efficiently emits white mixed light.

FIG. 9 shows an emission spectrum of the overall radiation according to an embodiment. The emission spectrum shows the primary radiation of the semiconductor chip 2 from the blue spectral range, and the secondary radiation of the conversion element 4 which is arranged in the beam path of the semiconductor chip 2. The conversion element 4 comprises the first phosphor 9 as conversion material $(La_{1-x}Ca_x)_3Si_6(N_{1-y}O_y)_{11}:Ce^{3+}$ wherein $0 \leq x \leq 1$ and $0 \leq y \leq 1$. The overall radiation is white mixed light at 4500 K.

The exemplary embodiments described in conjunction with the figures and the features thereof can also be combined with one another in accordance with further exemplary embodiments, even if such combinations are not explicitly shown in the figures. Furthermore, the exemplary embodiments described in conjunction with the figures can have additional or alternative features according to the description in the general part.

The invention is not restricted to the exemplary embodiments by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

This patent application claims the priority of German patent application 10 2016 104 875.5, the disclosure content of which is hereby incorporated by reference.

LIST OF REFERENCES 100 optoelectronic component
1 substrate
2 semiconductor chip
3 adhesive layer
4 conversion element
5 reflection element or housing
6 contact webs
7 lens
8 protective electrode
9 first phosphor
10 second phosphor
11 matrix material
G overall emission
12 recess
21 further semiconductor chip
31 further adhesive layer
41 first layer
42 second layer
12 Planck's black body curve

The invention claimed is:

1. An optoelectronic component comprising
a semiconductor chip for generating a primary radiation in the blue spectral range,
a conversion element which is arranged in the beam path of the semiconductor chip and which is configured to generate secondary radiation from the primary radiation, wherein the conversion element comprises a plurality of phosphors as conversion materials, and each of the plurality of phosphors is Ce-doped;
wherein a first phosphor of the plurality of phosphors is $(La_{1-x}Ca_x)_3Si_6(N_{1-y}O_y)_{11}:Ce^{3+}$ wherein $0 \leq x \leq 1$ and $0 < y \leq 1$, wherein an overall emission exiting the component is white mixed light.

2. The optoelectronic component according to claim 1, wherein the first phosphor has a wavelength maximum between 530 nm and 570 nm inclusive.

3. The optoelectronic component according to claim 1, wherein the color locus of the component is between 6000 K and 3500 K on the Planck's black body curve.

4. The optoelectronic component according to claim 1, wherein the semiconductor chip has a semiconductor layer sequence composed of InGaN and the primary radiation has a wavelength maximum between 380 nm and 480 nm inclusive.

5. The optoelectronic component according to claim 1, wherein the first phosphor has a color locus for Cx between 0.420 and 0.490 and for Cy between 0.5000 and 0.560.

6. The optoelectronic component according to claim 1, wherein the first phosphor is $La_3Si_6(N_{1-y}O_y)_{11}:Ce^{3+}$ wherein $0 \leq y \leq 0.05$.

7. The optoelectronic component according to claim 1, wherein the conversion element comprises a second phosphor, wherein the white mixed light of the component is composed of the primary radiation of the semiconductor chip and of the radiation emitted by the first and second phosphors, wherein the second phosphor is a Ce-doped $(Y,Lu)_3(Al,Ga)_5O_{12}$.

8. The optoelectronic component according to claim 1, wherein the conversion element comprises a second phosphor,
wherein the white mixed light of the component is composed of the primary radiation of the semiconductor chip and of the radiation emitted by the first and second phosphors.

9. The optoelectronic component according to claim 8, wherein the first phosphor and the second phosphor are dispersed in a matrix material and directly follow a radiation exit area of the semiconductor chip, wherein the matrix material is a silicone, an epoxy or a hybrid material.

10. The optoelectronic component according to claim 8, wherein the conversion element is formed as a layer system comprising at least two layers, wherein the first layer comprises the first phosphor and the second layer comprises the second phosphor, wherein the second layer is arranged between the semiconductor chip and the first layer.

11. The optoelectronic component according to claim 1, comprising a further semiconductor chip which is configured to generate a further primary radiation in the blue spectral range, wherein the semiconductor chips are arranged in a common recess, wherein the conversion element is formed as a casting and surrounds both semiconductor chips in a form-fitting manner.

12. The optoelectronic component according to claim 1, wherein the conversion element is formed as a ceramic.

13. A flashlight illumination for a portable device, comprising at least one optoelectronic component according to claim 1.

14. A method for producing an optoelectronic component comprising the steps of:
A) providing a semiconductor chip for generating a primary radiation in the blue spectral range,
B) providing a conversion element which is arranged in the beam path of the semiconductor chip and is configured to generate secondary radiation from the primary radiation, wherein the conversion element comprises a plurality of phosphors as conversion materials, and each of the plurality of phosphors is Ce-doped;
wherein a first phosphor of the plurality of phosphors is $(La_{1-x}Ca_x)_3Si_6(N_{1-y}O_y)_{11}:Ce^{3+}$ wherein $0 \le x \le 1$ and $0 < y \le 1$,
wherein an overall radiation exiting the component is white mixed light.

15. An optoelectronic component comprising
a semiconductor chip for generating a primary radiation in the blue spectral range,
a conversion element which is arranged in the beam path of the semiconductor chip and which is configured to generate secondary radiation from the primary radiation,
wherein the conversion element comprises at least one first phosphor as a conversion material,
wherein the first phosphor is $(La_{1-x}Ca_x)_3Si_6(N_{1-y}O_y)_{11}:Ce^{3+}$ wherein $0 < x \le 1$ and $0.5 \le y \le 1$,
wherein an overall emission exiting the component is white mixed light.

16. The optoelectronic component according to claim 15, wherein $0.5 \le x \le 1$.

17. The optoelectronic component according to claim 15, wherein the conversion element exclusively comprises the first phosphor as a conversion material, wherein the color locus of the component is between 6000 K and 3500 K on the Planck's black body curve.

18. The optoelectronic component according to claim 15, wherein the conversion element comprises a second phosphor,
wherein the white mixed light of the component is composed of the primary radiation of the semiconductor chip and of the radiation emitted by the first and second phosphors,
wherein the second phosphor is selected from a group comprising $(Ca, Sr)AlSiN_3:Eu^{2+}$, $Sr(Ca, Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$ and $(Ba,Sr)_2Si_5N_8:Eu^{2+}$.

19. The optoelectronic component according to claim 15, wherein the conversion element comprises exclusively cerium-doped phosphors as conversion materials.

\* \* \* \* \*